United States Patent
Lo (10) Patent No.: US 10,812,086 B2
(45) Date of Patent: Oct. 20, 2020

(54) N-BIT COUNTER AND FREQUENCY DIVIDER

(71) Applicant: REALTEK SEMICONDUCTOR CORPORATION, Hsinchu (TW)

(72) Inventor: Jyi-Sy Lo, Taoyuan (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/585,006

(22) Filed: Sep. 27, 2019

(65) Prior Publication Data
US 2020/0153441 A1     May 14, 2020

(30) Foreign Application Priority Data
Nov. 9, 2018 (TW) .............................. 107139810 A (51) Int. Cl.
| | | |
|---|---|---|
| *H03K 23/58* | (2006.01) | |
| *H03K 21/38* | (2006.01) | |
| *H03K 23/66* | (2006.01) | |

(52) U.S. Cl.
CPC ............. *H03K 23/58* (2013.01); *H03K 21/38* (2013.01); *H03K 23/66* (2013.01)

(58) Field of Classification Search
CPC ..................................................... H03K 23/58
See application file for complete search history.

(56) References Cited

U.S. PATENT DOCUMENTS

| | | | | |
|---|---|---|---|---|
| 8,981,821 B2* | 3/2015 | Potty | ...................... | H04B 15/04 |
| | | | | 327/113 |
| 9,018,988 B2* | 4/2015 | Abdel-Haleem | ....... | H03L 7/193 |
| | | | | 327/117 |

FOREIGN PATENT DOCUMENTS

CN     102118158 A     7/2011

OTHER PUBLICATIONS

OA letter of counterpart TW application of application No. 107139810 dated Mar. 29, 2019. Summary of the OA letter: Claims 9-10 are rejected as being anticipated by the cited reference 1 (CN 102118158 A).

* cited by examiner

*Primary Examiner* — Hai L Nguyen
(74) *Attorney, Agent, or Firm* — WPAT, PC (57) ABSTRACT

Disclosed is an N-bit counter including: an N-bit counting circuit starting counting from an initial value to generate a count value composed of N bits, and being loaded with the initial value to restart counting from the initial value when a reload signal changes from a first reload level to a second reload level; a reload signal generating circuit having the reload signal change from the first reload level to the second reload level when the logical conjunction of K bit(s) among the N bits changes from a first value to a second value; and a reset circuit having a reset signal change from a first reset level to a second reset level so as to have the reload signal change from the second reload level to the first reload level and thereby allow the N-bit counting circuit to restart counting.

20 Claims, 10 Drawing Sheets

N-BIT COUNTER AND FREQUENCY DIVIDER

BACKGROUND OF THE INVENTION

1. Field of the Invention

The present invention relates to an N-bit counter and a frequency divider, especially to an N-bit counter and a frequency divider that can withstand the influence of glitch.

2. Description of Related Art

Figure 1:
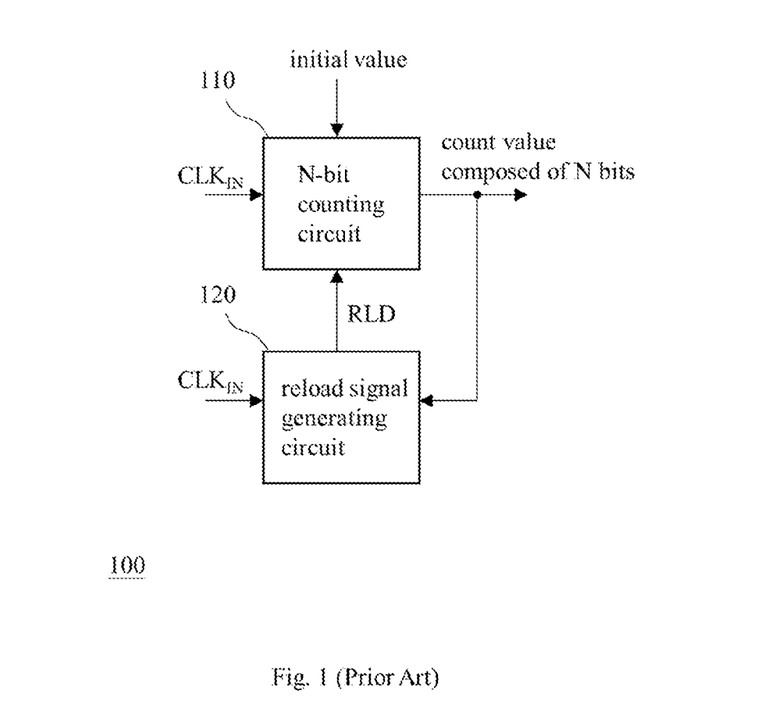
FIG. 1 shows a conventional N-bit programmable counter.

FIG. 1 shows a conventional N-bit programmable counter 100 including an N-bit counting circuit 110 (e.g., asynchronous counter) and a reload signal generating circuit 120. The N-bit counting circuit 110 starts counting from an initial value according to a clock signal $CLK_{IN}$ and thereby generates a count value composed of N bits. The reload signal generating circuit 120 changes the level of a reload signal RLD according to the trigger of the clock signal $CLK_{IN}$ when all of the N bits are at a high level (i.e., each of the N bits is "1") so as to have the N-bit counting circuit 110 be reloaded with the initial value according to the reload signal RLD and restart counting from the initial value.

However, when all of the N bits are about to be at the high level, if the quality of the clock signal $CLK_{IN}$ is not good enough and includes glitch, a counting unit (e.g., D-type flip flop) of the N-bit counting circuit 110 may enter a metastable state due to the trigger of the glitch and thus the N-bit counting circuit 110 may not output N high-level bits (i.e., all the N bits being at the high level) timely, which may lead to a condition that the trigger of the clock signal $CLK_{IN}$ and the occurrence of all the N bits being at the high level do not come up simultaneously and result in that the reload signal generating circuit 120 misses the timing to change the level of the reload signal RLD. Once the level of the reload signal RLD does not change when all the N bits are at the high level, the N-bit counting circuit 110 will not be loaded with the initial value and will start counting from zero instead; before the N-bit counting circuit 110 has the next chance to be loaded with the initial value to restart counting from the initial value, the N-bit counting circuit 110 has to wait $2^N$ cycles of the clock signal $CLK_{IN}$ (i.e., the time for the count value changing from N low-level bits to N high-level bits). This problem will cause a circuit (e.g., phase-locked loop using the reload signal RLD of the N-bit programmable counter 100 or the reverse of RLD as a frequency-divided clock) relying on the count result of the N-bit programmable counter 100 to operate abnormally.

SUMMARY OF THE INVENTION

An object of the present invention is to provide an N-bit counter and a frequency divider that can withstand the influence of glitch to prevent the problem of the prior art.

The present invention discloses an N-bit counter. An embodiment of the N-bit counter includes an N-bit counting circuit, a reload signal generating circuit, and a reset circuit. The N-bit counting circuit is configured to start counting from an initial value according to an input clock to generate a count value composed of N bits, and the N-bit counting circuit is also configured to be loaded with the initial value to restart counting from the initial value when a level of a reload signal changes from a first reload level to a second reload level, in which the N is an integer greater than one. The reload signal generating circuit is configured to output the reload signal; in detail, the reload signal generating circuit is configured to have the level of the reload signal change from the first reload level to the second reload level when a logical conjunction of K bit(s) among the N bits changes from a first value to a second value, in which the K is a positive integer not greater than the N. The reset circuit is configured to generate a reset signal; in detail, the reset circuit is configured to have a level of the reset signal change from a first reset level to a second reset level when the level of the reload signal changes from the first reload level to the second reload level so that the reload signal generating circuit is reset in response to the level change of the reset signal and thereby the level of the reload signal returns from the second reload level to the first reload level to allow the N-bit counting circuit to restart counting from the initial value.

Another embodiment of the N-bit counter of the present invention includes an N-bit counting circuit and a reload control circuit. The N-bit counting circuit is configured to start counting from an initial value according to an input clock to generate a count value composed of N bits, and the N-bit counting circuit is also configured to be loaded with the initial value to restart counting from the initial value when a level of a reload signal changes from a first reload level to a second reload level, in which the N is an integer greater than one. The reload control circuit is configured to output the reload signal; in detail, the reload control circuit is configured to have the level of the reload signal change from the first reload level to the second reload level when a logical conjunction of K bit(s) among the N bits changes from a first value to a second value, and the reload control circuit is also configured to have the level of the reload signal returns from the second reload level to the first reload level after the level of the reload signal changes from the first reload level to the second reload level for a shortest time so as to allow the N-bit counting circuit to restart counting from the initial value, in which the K is a positive integer not greater than the N.

The present invention further discloses a frequency divider. An embodiment of the frequency divider includes an N-bit counting circuit and a reload control circuit. The N-bit counting circuit is configured to start counting from an initial value according to an input clock to generate a count value composed of N bits, and the N-bit counting circuit is also configured to be loaded with the initial value to restart counting from the initial value when a level of a reload signal changes from a first reload level to a second reload level. The reload control circuit is configured to output the reload signal and an output clock; in detail, the reload control circuit is configured to have the level of the reload signal change from the first reload level to the second reload level when a logical conjunction of K bit(s) among the N bits changes from a first value to a second value, and the reload control circuit is also configured to have the level of the reload signal returns from the second reload level to the first reload level after the level of the reload signal changes from the first reload level to the second reload level so as to allow the N-bit counting circuit to restart counting from the initial value, in which the K is a positive integer not greater than the N.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention discloses an N-bit counter and a frequency divider capable of withstanding the influence of glitch so that the time for the N-bit counter finishing each round of a count operation won't substantially vary with different rounds and the frequency deviation of an output clock of the frequency divider won't be excessive.

Figure 2:
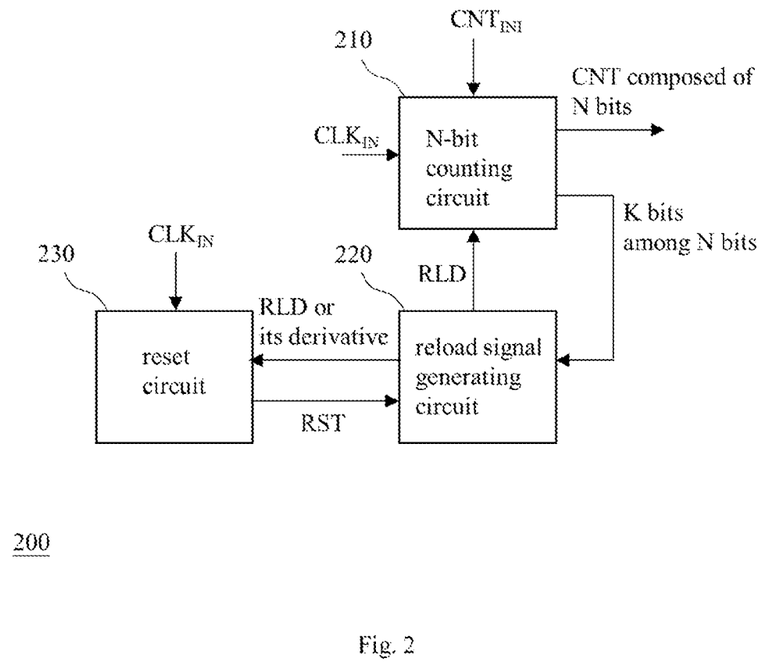
FIG. 2 shows an embodiment of the N-bit counter of the present invention.

FIG. 2 shows an embodiment of the N-bit counter of the present invention. The N-bit counter 200 of FIG. 2 includes an N-bit counting circuit 210, a reload signal generating circuit 220, and a reset circuit 230, in which the N-bit counter 200 is an asynchronous counter (a.k.a. ripple counter) and the N is an integer greater than one. It should be noted that the N-bit counter of the present invention could be a counter other than an asynchronous counter providing this N-bit counter is operable with the features of the present invention.

Please refer to FIG. 2. The N-bit counting circuit 210 is configured to start counting from an initial value $CNT_{INI}$ (e.g., $bt_0$, $bt_1$, . . . , and $bt_{(N-1)}$ of FIG. 3) according to an input clock $CLK_{IN}$ and thereby generate a count value CNT composed of N bits (e.g., $q_0$, $q_1$, . . . , $q_{(N-1)}$ of FIG. 3). The N-bit counting circuit 210 is also configured to be loaded with the initial value $CNT_{INI}$ when the level of a reload signal RLD changes from a first reload level (e.g., low voltage level) to a second reload level (e.g., high voltage level), and then restart counting from the initial value $CNT_{INI}$ when the level of the reload signal RLD returns from the second reload level to the first reload level. In an exemplary implementation of the embodiment of FIG. 2, the initial value $CNT_{INI}$ is programmable so that the N-bit counter 200 is a programmable counter.

Figure 3:
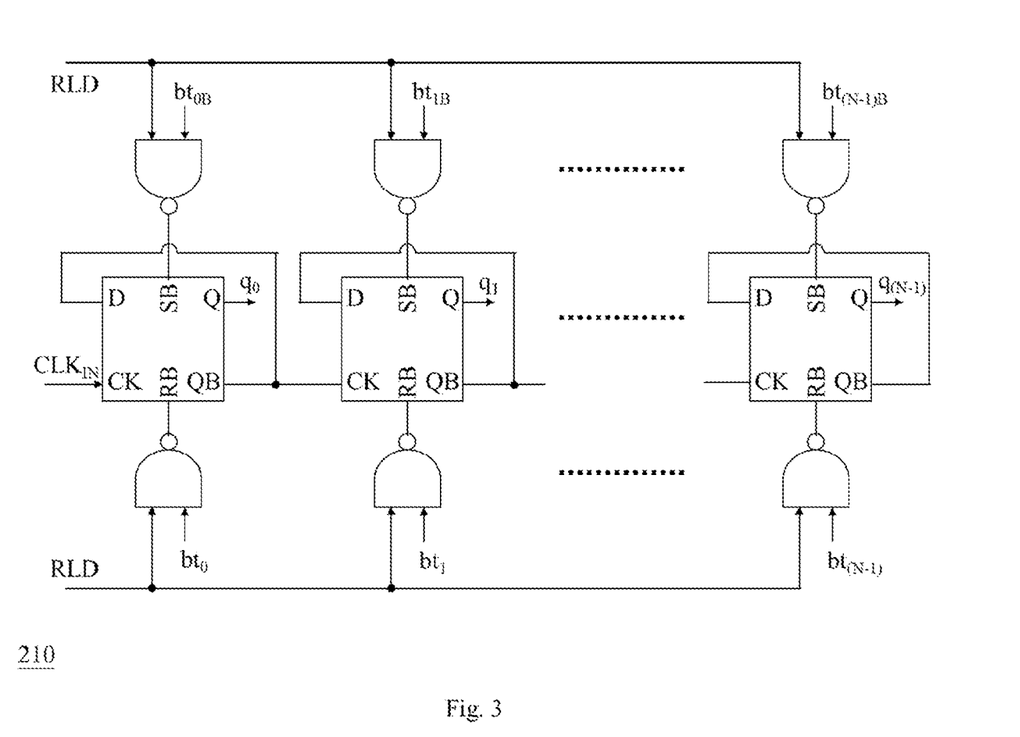
FIG. 3 shows an embodiment of the N-bit counting circuit of FIG. 2.

FIG. 3 shows an embodiment of the N-bit counting circuit 210. As shown in FIG. 3, the N-bit counting circuit 210 includes N D-type flip flops (DFFs) and 2N NAND gates. Each of the DFFs includes an input terminal (D), a clock terminal (CK), an output terminal (Q), an output inverse terminal (QB), a reset terminal (RB), and a set terminal (SB); the NAND gate connecting with the reset terminal sets the signal level at the reset terminal according to the reload signal RLD and one bit of the initial value $CNT_{INI}$ (i.e., one of $bt_0$, $bt_1$, . . . , $bt_{(N-1)}$) and the NAND gate connecting to the set terminal sets the signal level at the set terminal according to the reload signal RLD and one bit of the reverse (i.e., one of $bt_{0B}$, $bt_{1B}$, . . . , $bt_{(N-1)B}$) of the initial value $CNT_{INI}$; when the level at the reset terminal changes from a high level to a low level, the output terminal is forced to output a signal of the low level; when the level at the set terminal changes from a high level to a low level, the output terminal is forced to output a signal of the high level; in the above two circumstances, the input of the input terminal is the reverse of the output of the output terminal. When the level of the reload signal RLD is the first reload level (e.g., low voltage level), each of the NAND gates outputs the reverse (e.g., high voltage level) of the first reload level and thus the N-bit counting circuit 210 executes a count operation according to the trigger of $CLK_{IN}$. More specifically, in the N-bit counting circuit 210 the input terminal of a current DFF transmits a current input value received by the input terminal to the output terminal of the current DFF according to the trigger of the input clock $CLK_{IN}$ received by the clock terminal of the current DFF so as to use the current input value as a next output value; meanwhile, the output inverse terminal of the current DFF outputs the reverse of the next output value as a next input value received by the input terminal and as the trigger for the clock terminal of a next DFF following the current DFF. When the level of the reload signal RLD changes from the first reload level to the second reload level (e.g., from a low voltage level to a high voltage level), each of the NAND gates outputs the reverse of this NAND gate's received bit (i.e., one of $bt_0$, $bt_1$, . . . , $bt_{(N-1)}$, or one of $bt_{0B}$, $bt_{1B}$, . . . , $bt_{(N-1)B}$) as the signal for this NAND gate's connected reset/set terminal; accordingly, the level of the input terminal of each DFF is set according to the signal level of this DFF's reset/set terminal and thereby this DFF can be loaded with the initial value $CNT_{INI}$. Since the function and operation of the above-mentioned DFFs and NAND gates are well known in this technical field, their detail is omitted here for conciseness.

Please refer to FIG. 2. The reload signal generating circuit 220 is configured to determine the level of the reload signal RLD according to K bit(s) among the N bits, in which the K is a positive integer not greater than the N. More specifically, the reload signal generating circuit 220 has the level of the reload signal RLD change from the first reload level to the second reload level when a logical conjunction of the K bit(s) changes from a first value (e.g., 1) to a second value (e.g., 0). The logical conjunction is the result of logical conjunction calculation or the equivalent thereof (e.g., multiplication of the K bits). For instance, the K bits are successive K bits and the K is smaller than the N; when the N-bit counter 200 carries out an incremental count operation, the K bits include the most significant bit (MSB) of the N bits without including the least significant bit (LSB) of the N bits; when the N-bit counter 200 carries out a countdown operation, the K bits include the LSB of the N bits without including the MSB of the N bits. It should be noted that the prior art described in this specification must generate a reload signal according to all of N bits while the reload signal generating circuit 220 of the present invention can optionally generate a reload signal according to a part of N bits rather than all of them. It should also be noted that the reload signal generating circuit 220 determines the level of the reload signal RLD according to the change of the logical conjunction instead of the change of the input clock $CLK_{IN}$; therefore, even though the input clock $CLK_{IN}$ includes glitch, the reload signal generating circuit 220 won't miss the timing for the control of the level of the reload signal RLD.

Figure 4:
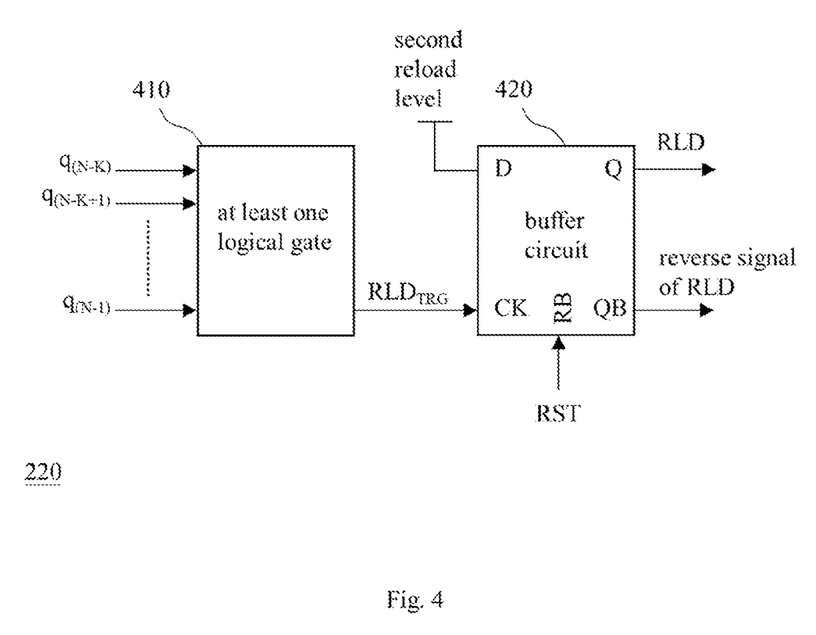
FIG. 4 shows an embodiment of the reload signal generating circuit of FIG. 2.
Figure 5:
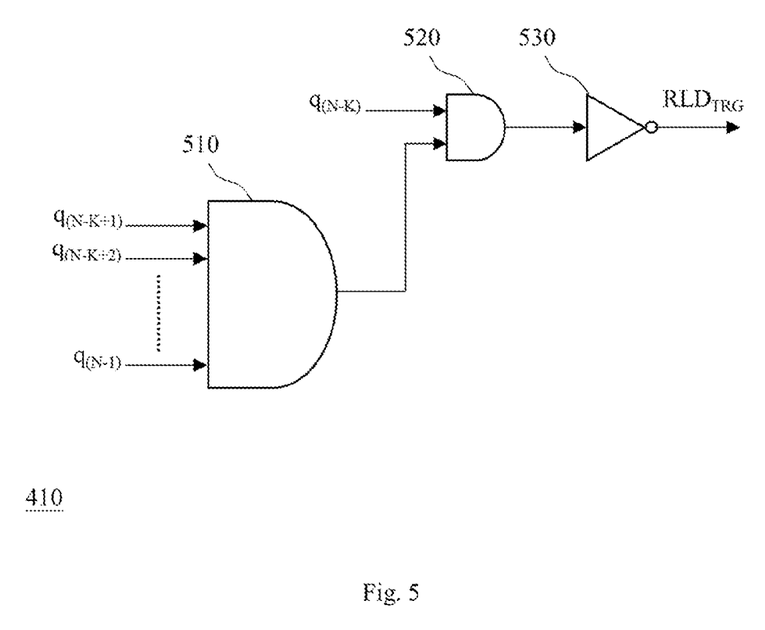
FIG. 5 shows an embodiment of the at least one logical gate of FIG. 4.

FIG. 4 shows an embodiment of the reload signal generating circuit 220. As shown in FIG. 4, the reload signal generating circuit 220 includes at least one logical gate 410 and a buffer circuit 420 (e.g., DFF). The logical gate 410 is configured to generate a reload trigger signal $RLD_{TRG}$ according to the K bit(s) (e.g., $q_{(N-K)}$, $q_{(N-K+1)}$, ..., $q_{(N-1)}$), and the buffer circuit 420 is configured to output the reload signal RLD. FIG. 5 shows an embodiment of the at least one logical gate 410; this embodiment includes a first AND gate 510, a second AND gate 520, and an inverter 530. The first AND gate 510 is configured to receive all of the K bits except the LSB $q_{(N-K+1)}$, $q_{(N-K+2)}$, ..., $q_{(N-1)}$); the second AND gate 520 is configured to receive the LSB of the K bits (e.g., $q_{(N-K)}$); the inverter 530 is configured to generate the reload trigger signal $RLD_{TRG}$ according to the output of the second AND gate 520; the function of the first AND gate 510 and the second AND gate 520 can be realized with a single AND gate, or the function of the first AND gate 510, the second AND gate 520, and the inverter 530 can be realized with a single NAND gate, or the function of the second AND gate 520 and the inverter 530 and be realized with a single NAND gate, so forth and so on. The buffer circuit 420 includes an input terminal (D), a clock terminal (CK), an output terminal (Q), an output inverse terminal (QB), and a reset terminal (RB). The input terminal is configured to receive a signal of the second reload level (e.g., high voltage level); the clock terminal is configured to receive the reload trigger signal $RLD_{TRG}$; the output terminal is configured to output the signal of the second reload level of the input terminal as the reload signal RLD when the level of the reload trigger signal $RLD_{TRG}$ changes from a first trigger level (e.g., low voltage level) to a second trigger level (e.g., high voltage level); the output terminal is also configured to output a signal of the first reload level (e.g., low voltage level) as the reload signal RLD when the level of a reset signal RST of the reset circuit 230 changes from a first reset level (e.g., high voltage level) to a second reset level (e.g., low voltage level); the output inverse terminal is configured to output the reverse of the signal (i.e., the reload signal RLD) of the output terminal; and the reset terminal is configured to receive the reset signal RST.

Figure 6:
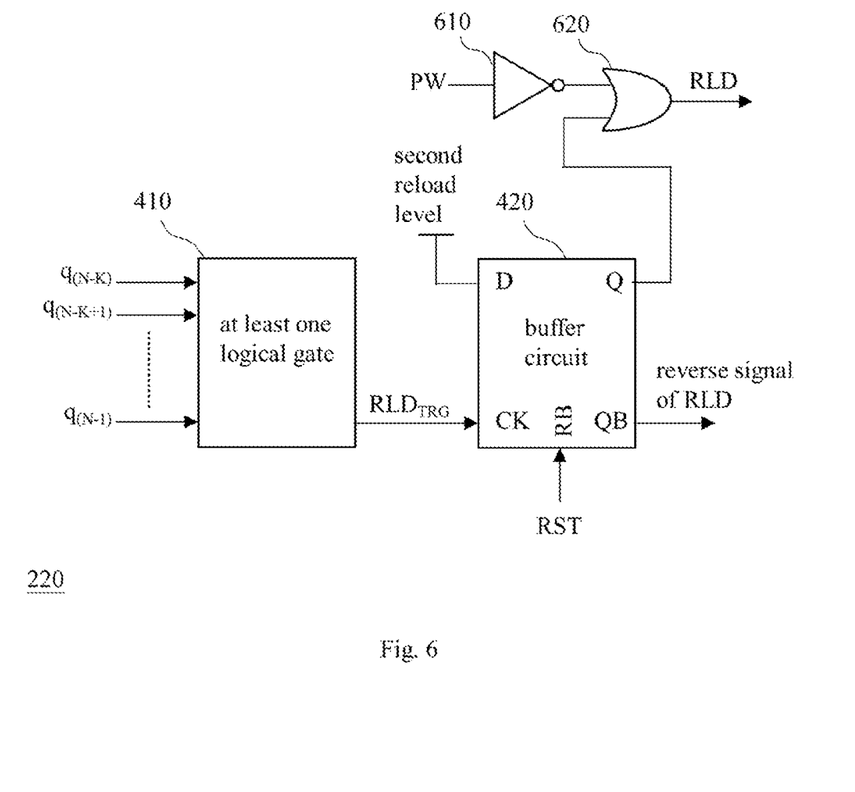
FIG. 6 shows another embodiment of the reload signal generating circuit of FIG. 2.

FIG. 6 shows another embodiment of the reload signal generating circuit 220. In comparison with FIG. 4, the reload signal generating circuit 220 of FIG. 6 further includes an inverter 610 and an OR gate 620. The inverter 610 is configured to output the reverse of a power reset signal PW. When the power supply for the N-bit counter 200 is started, the level of the power reset signal PW changes from a low level (e.g., low voltage level) to a high level (e.g., high voltage level) so that the inverter 610 outputs a signal of the low level after the power supply is started. The OR gate 620 outputs the reload signal RLD after the power supply is started.

Please refer to FIG. 2. The reset circuit 230 is configured to generate the reset signal RST. More specifically, the reset circuit 230 is configured to change the level of the reset signal RST from a first reset level to a second reset level when the level of the reload signal RLD changes from the first reload level to the second reload level; accordingly, the reload signal generating circuit 220 is reset in response to the level change of the reset signal RST and then the level of the reload signal RLD returns to the first reload level from the second reload level due to the reset of the reload signal generating circuit 220, which allows the N-bit counting circuit 210 restarts counting from the initial value $CNT_{INT}$.

Figure 7:
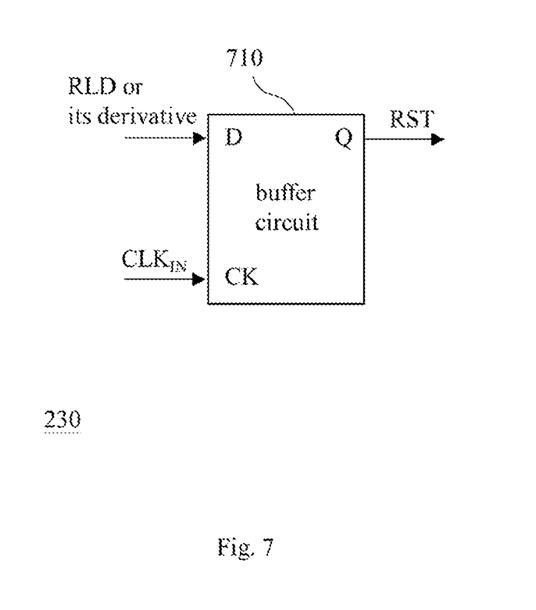
FIG. 7 shows an embodiment of the reset circuit of FIG. 2.

FIG. 7 shows an embodiment of the reset circuit 230. As shown in FIG. 7, the reset circuit 230 includes a buffer circuit 710 (e.g., DFF). The buffer circuit 710 includes an input terminal (D), a clock terminal (CK), and an output terminal (Q). The input terminal is configured to receive the reload signal RLD or the derivative thereof (e.g., the reverse of the reload signal RLD); the clock terminal is configured to receive the input clock $CLK_{IN}$; the output terminal is configured to output the signal received by the input terminal as the predecessor of the reset signal RST or the reset signal RST itself according to the trigger of the input clock $CLK_{IN}$. For instance, when the input terminal of the buffer circuit 710 receives the reverse of the reload signal RLD, the output terminal of the buffer circuit outputs the reset signal RST; when the level of the reload signal RLD changes from the first reload level (e.g., low voltage level) to the second reload level (e.g., high voltage level), the buffer circuit 710 has the level of the reset signal RST changes from a first reset level (e.g., high voltage level) to a second reset level (e.g., low voltage level) to reset the reload signal generating circuit 220 and consequently the level of the reload signal RLD returns to the first reload level from the second reload level and the reload operation is finished. It should be noted that the reload signal RLD/the reset signal RST can be optionally outputted as an output clock $CLK_{OUT}$; since the level change of each of the reload signal RLD and the reset signal RST is based on the trigger of the logical conjunction of the K bit(s) instead of the trigger of the input clock $CLK_{IN}$, even though the input clock $CLK_{IN}$ includes glitch, the glitch merely has slight influence on the time point of the change of the logical conjunction of the K bit(s) and won't substantially affect the cycle of the level change of the reload signal RLD/the reset signal RST; in other words, the frequency of the output clock $CLK_{OUT}$ won't change substantially and will approximate to the frequency of the input clock $CLK_{IN}$ divided by "$2^N - CNT_{INT} + X$" (when the N-bit counter 200 executes the aforementioned incremental count operation) or divided by the initial value "$CNT_{INT} + X$" (when the N-bit counter 200 executes the aforementioned countdown operation), in which the "+X" of the divisor could be one of +1, +2, +3, ..., so forth and so on in view of the demand for implementation. The "+X" is introduced for the following reason: after the level of the reload signal RLD changes from the first reload level to the second reload level, the N-bit counting circuit 210 should wait at least one cycle of the input clock $CLK_{IN}$ before starting counting, in which the waiting is for the level of the reload signal RLD returns to the first reload level from the second reload level.

Figure 8:
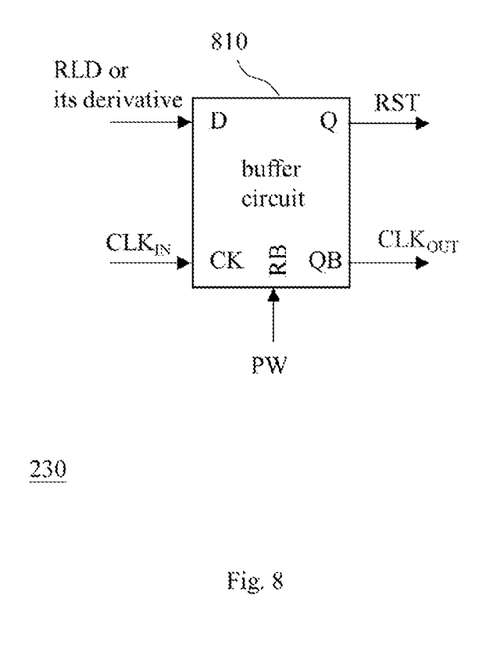
FIG. 8 shows another embodiment of the reset circuit of FIG. 2.

FIG. 8 shows another embodiment of the reset circuit 230. In comparison with FIG. 7, the buffer circuit 810 (e.g., DFF) of the rest circuit 230 of FIG. 8 further includes an output inverse terminal (QB) and a set terminal (SB). The output inverse terminal is configured to output the reverse of the signal of the output terminal (Q) as the aforementioned output clock $CLK_{OUT}$, and the set terminal is configured to receive the aforementioned power reset signal PW so as to have the level of the reset signal RST returns to the second reset level (e.g., low voltage level) from the first reset level (e.g., high voltage level) when the power reset signal PW is at the low level.

Figure 9:
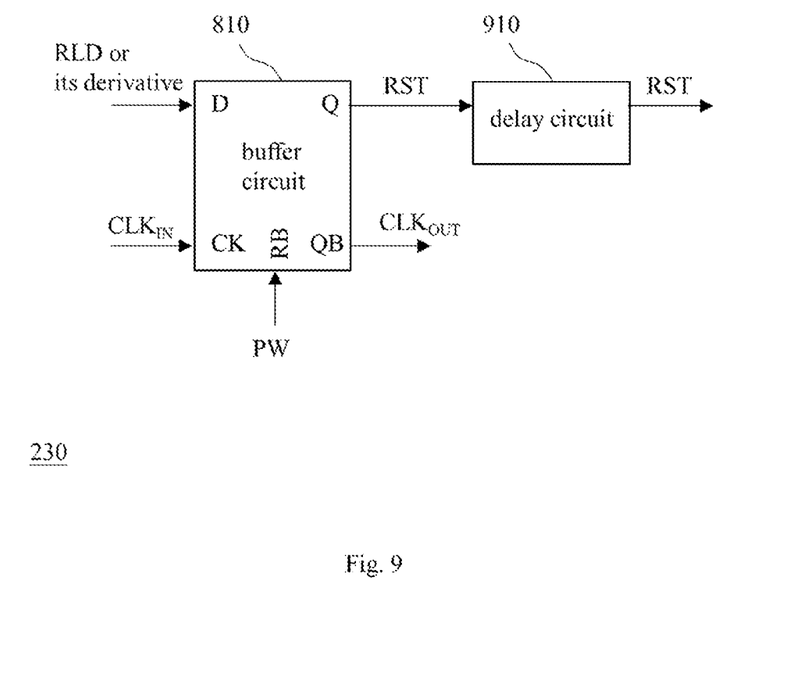
FIG. 9 shows yet another embodiment of the reset circuit of FIG. 2.

It should be noted that since the reset circuit 230 itself and the path between the reset circuit 230 and the reload signal generating circuit 220 contribute transmission delay, a reload time point of the reload signal RLD changing from the first reload level to the second reload level will be earlier than a reset time point of the reset signal RST changing from the first reset level to the second reset level, and the time difference between the reload time point and the reset time point won't be shorter than a predetermined time difference so that the N-bit counting circuit 210 can successfully be loaded with the initial value $CNT_{INI}$. The above-mentioned predetermined time difference can be determined by the design of the reset circuit 230 and/or the design of the path between the reset circuit 230 and the reload signal generating circuit 220, or it is determined by a known or self-developed delay circuit. For instance, as shown in FIG. 9, the reset circuit 230 optionally includes a delay circuit 910 which delays the reset signal RST for a predetermined time so as to make sure the time difference between the reload time point and the reset time point is not shorter than the predetermined time difference.

Figure 10:
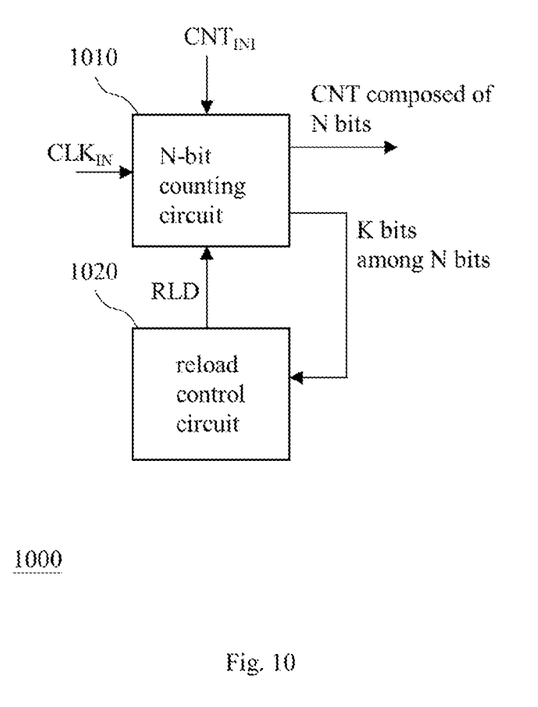
FIG. 10 shows another embodiment of the N-bit counter of the present invention.

FIG. 10 shows another embodiment of the N-bit counter of the present invention. The N-bit counter 1000 of FIG. 10 includes an N-bit counting circuit 1010 and a reload control circuit 1020. The N-bit counting circuit 1010 is configured to start counting from an initial value $CNT_{INI}$ according to an input clock $CLK_{IN}$ to generate a count value CNT composed of N bits, and the N-bit counting circuit 1010 is also configured to be loaded with the initial value $CNT_{INI}$ to restart counting from the initial value $CNT_{INI}$ when a level of a reload signal RLD changes from a first reload level to a second reload level, in which the N is an integer greater than one. The reload control circuit 1020 is configured to output the reload signal RLD; in detail, the reload control circuit 1020 is configured to have the level of the reload signal RLD change from the first reload level to the second reload level when a logical conjunction of K bit(s) among the N bits changes from a first value to a second value, and the reload control circuit 1020 is also configured to have the level of the reload signal RLD returns from the second reload level to the first reload level after the level of the reload signal RLD changes from the first reload level to the second reload level for a shortest time (e.g., the aforementioned predetermined time difference) so as to allow the N-bit counting circuit 1010 to restart counting from the initial value $CNT_{INI}$, in which the K is a positive integer not greater than the N. An embodiment of the N-bit counting circuit 1010 is the N-bit counting circuit 210 of FIG. 2. An embodiment of the reload control circuit 1020 is realized with the aforementioned reload signal generating circuit 220 and the reset circuit 230 of FIG. 2.

It should be noted that when the reload control circuit 1020 includes the aforementioned reload signal generating circuit 220 and/or the reset circuit 230 to output the reload signal RLD or the derivative thereof (e.g., the reverse of the reload signal RLD, the reset signal RST, or the reverse of the reset signal RST) as the aforementioned output clock $CLK_{OUT}$, the N-bit counter 100 functions as a frequency divider.

Since those of ordinary skill in the art can appreciate the detail and modification of the embodiment of FIG. 10 by referring to the disclosure of the embodiments of FIGS. 2-9, which implies that some or all of the features of the embodiments of FIGS. 2-9 can be applied to the embodiment of FIG. 10 in a reasonable way, repeated and redundant description is omitted here for conciseness. It should be noted that people of ordinary skill in the art can implement the present invention by selectively using some or all of the features of any embodiment in this specification or selectively using some or all of the features of multiple embodiments in this specification as long as such implementation is practicable, which means that the present invention can be carried out flexibly.

To sum up, the N-bit counter and frequency divider of the present invention can withstand the influence of glitch; as a result, the N-bit counter can be reloaded timely to ensure that the frequency of the output clock of the frequency divider is correct.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. An N-bit counter, comprising:
   an N-bit counting circuit configured to start counting from an initial value according to an input clock to generate a count value composed of N bits, and the N-bit counting circuit configured to be loaded with the initial value to restart counting from the initial value when a level of a reload signal changes from a first reload level to a second reload level, in which the N is an integer greater than one;
   a reload signal generating circuit configured to output the reload signal, and the reload signal generating circuit configured to have the level of the reload signal change from the first reload level to the second reload level when a logical conjunction of K bit(s) among the N bits changes from a first value to a second value, in which the K is a positive integer not greater than the N; and
   a reset circuit configured to generate a reset signal and have a level of the reset signal change from a first reset level to a second reset level when the level of the reload signal changes from the first reload level to the second reload level so that the reload signal generating circuit is reset and the level of the reload signal returns from the second reload level to the first reload level to allow the N-bit counting circuit to restart counting from the initial value.

2. The N-bit counter of claim 1, wherein the initial value is programmable.

3. The N-bit counter of claim 1, wherein the reset circuit is further configured to output an output clock, the reset circuit has a level of the output clock change from a first clock level to a second clock level when the level of the reload signal changes from the first reload level to the second reload signal, and a frequency of the output clock is lower than a frequency of the input clock.

4. The N-bit counter of claim 1, wherein the K is smaller than the N, the K bits are successive K bits among the N bits.

5. The N-bit counter of claim 4, wherein the successive K bits include a most significant bit (MSB) or a least significant bit (LSB) of the N bits.

6. The N-bit counter of claim 1, wherein a reload time point at which the level of the reload signal changes from the first reload level to the second reload level is earlier than a reset time point at which the level of the reset signal changes from the first reset level to the second reset level, and a time difference between the reload time point and the reset time point is not less than a predetermined time difference.

7. The N-bit counter of claim 6, wherein the reset circuit includes a delay circuit, and the delay circuit delays the reset signal for a predetermined time so as to have the time difference between the reload time point and the reset time point is not less than the predetermined time difference.

8. The N-bit counter of claim 1, wherein the reload signal generating circuit includes:
   at least one logical gate configured to generate a reload trigger signal according to the K bit(s); and a buffer circuit configured to have the level of the reload signal change from the first reload level to the second reload level when a level of the reload trigger signal changes from a first trigger level to a second trigger level, and the temporary storage circuit further configured to have the level of the reload signal change from the second reload level to the first reload level when the level of the reset signal changes from the first reset level to the second reset level.

9. The N-bit counter of claim 1, wherein the reset circuit includes:
a buffer circuit configured to output the reload signal or a derivative thereof as the reset signal according to a trigger of the input clock.

10. The N-bit counter of claim 1, wherein the N-bit counter is a ripple counter.

11. An N-bit counter, comprising:
an N-bit counting circuit configured to start counting from an initial value according to an input clock to generate a count value composed of N bits, and the N-bit counting circuit configured to be loaded with the initial value to restart counting from the initial value when a level of a reload signal changes from a first reload level to a second reload level, in which the N is an integer greater than one; and
a reload control circuit configured to output the reload signal, the reload control circuit also configured to have the level of the reload signal change from the first reload level to the second reload level when a logical conjunction of K bit(s) among the N bits changes from a first value to a second value, and the reload control circuit further configured to have the level of the reload signal returns from the second reload level to the first reload level after the level of the reload signal changes from the first reload level to the second reload level for a shortest time so as to allow the N-bit counting circuit to restart counting from the initial value, in which the K is a positive integer not greater than the N.

12. The N-bit counter of claim 11, wherein the initial value is programmable.

13. The N-bit counter of claim 12, wherein the reload control circuit is configured to output an output clock and configured to change a level of the output clock when the level of the reload signal changes from the first reload level to the second reload level, and a frequency of the output clock is lower than a frequency of the input clock.

14. The N-bit counter of claim 13, wherein the N-bit counter is a ripple counter.

15. The N-bit counter of claim 11, wherein the K is smaller than the N, and the K bits are successive K bits among the N bits.

16. The N-bit counter of claim 15, wherein the successive K bits include a most significant bit or a least significant bit of the N bits.

17. The N-bit counter of claim 11, wherein the reload control circuit includes a delay circuit configured to control the length of the shortest time.

18. A frequency divider, comprising:
an N-bit counting circuit configured to start counting from an initial value according to an input clock to generate a count value composed of N bits, and the N-bit counting circuit configured to be loaded with the initial value to restart counting from the initial value when a level of a reload signal changes from a first reload level to a second reload level; and
a reload control circuit configured to output the reload signal and an output clock, the reload control circuit also configured to have the level of the reload signal change from the first reload level to the second reload level when a logical conjunction of K bit(s) among the N bits changes from a first value to a second value, and the reload control circuit further configured to have the level of the reload signal returns from the second reload level to the first reload level after the level of the reload signal changes from the first reload level to the second reload level so as to allow the N-bit counting circuit to restart counting from the initial value, in which the K is a positive integer not greater than the N.

19. The frequency divider of claim 18, wherein the initial value is programmable.

20. The frequency divider of claim 18, wherein the K is smaller than the N and the K bits are successive K bits among the N bits.

* * * * *